(12) United States Patent
Aldrich

(10) Patent No.: US 7,558,712 B1
(45) Date of Patent: Jul. 7, 2009

(54) SYSTEM AND METHOD FOR PROGRAMMATICALLY ABSTRACTING MODEL COMPONENTS

(75) Inventor: William J. Aldrich, Natick, MA (US)

(73) Assignee: The MathWorks, Inc., Natick, MA (US)

(*) Notice: Subject to any disclaimer, the term of this patent is extended or adjusted under 35 U.S.C. 154(b) by 0 days.

(21) Appl. No.: 11/890,008

(22) Filed: Aug. 2, 2007

Related U.S. Application Data

(63) Continuation of application No. 11/296,940, filed on Dec. 8, 2005.

(51) Int. Cl.
*G06F 7/60* (2006.01)
*G06G 7/48* (2006.01)

(52) U.S. Cl. .............................. 703/2; 703/6
(58) Field of Classification Search ................ 703/2, 703/6; 716/3, 5, 2
See application file for complete search history.

(56) References Cited

U.S. PATENT DOCUMENTS 7,415,403 B2 * 8/2008 McGaughy ................. 703/14

OTHER PUBLICATIONS

Aldrich et al.; Managing Verification Activities Using SVM; Nov. 3, 2004; Book "Formal Methods and Software Engineering"; ISBN 978-3-540-23841-6; pp. 61-75.*

Aldrich, "Using model coverage analysis to improve the controls development process", AIAA 2002, pp. 1-11.*
Ansgar Fehnker and Bruce H. Krogh; Hybrid System Verification Is Not a Sinecure, The Electronic Throttle Control Case Study; Springer-Verlag; ATVA 2004; LNCS 3299; pp. 263-277.*
Aldrich, Bill et al., "Managing Verification Activities Using SVM," *Formal Methods and Software Engineering*, pp. 61-75 (2004).
Aldrich, William, "Using Model Coverage Analysis to Improve the Controls Development Process," *The MathWorks, Aerospace and Defense Digest* (2004).

* cited by examiner

*Primary Examiner*—Paul L Rodriguez
*Assistant Examiner*—Juan C Ochoa
(74) *Attorney, Agent, or Firm*—Lahive & Cockfield, LLP; Kevin J. Canning

(57) ABSTRACT

A systematic model transformation that replaces individual components of a model that are identified as incompatible with a type of analysis is discussed. The identified incompatible components are replaced with an alternative component or components that is/are simplified to support the analysis being performed. Each simplified component is composed of one or more primitive elements in a construct that approximates the original design behavior and supports the desired analysis technique. The result of the automated abstraction process is an updated model design that has the same fundamental structure as the original model design and can be executed in the same manner as the original model design. Each simplified component may have a configuration setting selectable by a user that enables it to revert to the form of the original component. The resulting updated model can be used to interactively investigate the abstraction and determine its validity and appropriateness.

16 Claims, 10 Drawing Sheets

SYSTEM AND METHOD FOR PROGRAMMATICALLY ABSTRACTING MODEL COMPONENTS

RELATED APPLICATION

This application is a continuation of U.S. patent application Ser. No. 11/296,940, filed Dec. 8, 2005, the contents of which are hereby incorporated by reference.

FIELD OF THE INVENTION

The illustrative embodiment of the present invention relates generally to computer-designed models, and more particularly to a mechanism for programmatically abstracting components in computer-designed models.

BACKGROUND

Computer models permit a designer to create graphical and textual representations of real-world systems. The models may include mathematical algorithms that have a clearly defined structure composed of many basic primitive components. Typical graphical models include block diagram models, state chart diagrams, and data flow diagrams. These computer models can include complex mathematical expressions with non-linearities and subtle interactions between processing elements. Within the design and simulation environment there is a need to perform various analysis techniques to prove that the system represented by the model performs as expected. Tools for performing these types of analyses work by mathematically analyzing the representation in the model design either by exhaustively searching for undesirable execution sequences or by formally proving properties.

Frequently the underlying technique for analyzing a model design has limitations as to what can be analyzed in that the analysis is only compatible with certain types of model components. To work around the limitations of an analysis technique, designs must be modified to remove the model constructs that are not compatible. For example, a technique that cannot handle non-linear arithmetic will require the transformation of a multiply operation into some other simpler alternative component. The process of preparing a design for analysis is called abstraction. This is often a tedious manual process that is error prone.

BRIEF SUMMARY

The illustrative embodiment of the present invention provides a systematic model transformation that replaces individual components of a model that are identified as incompatible with a type of analysis. The identified incompatible components are replaced with an alternative component or components that is/are simplified to support the analysis being performed. Each simplified component is composed of one or more primitive elements in a construct that approximates the original design behavior and supports the desired analysis technique. The result of the automated abstraction process is an updated model design that has the same fundamental structure as the original model design and can be executed in the same manner as the original model design. Each simplified component may have a configuration setting selectable by a user that enables it to revert to the form of the original component. The resulting updated model can be used to interactively investigate the abstraction and determine its validity and appropriateness.

In one embodiment, a method of analyzing graphical models includes the step of providing an original graphical model, the original graphical model including multiple components. The method also indicates a desired type of analysis to be performed on the original graphical model and identifies programmatically at least one of the multiple components as including elements that are incompatible with the desired type of analysis. In one aspect, the method additionally abstracts the at least one identified component into a simplified component form compatible with the desired type of analysis. The simplified component form replaces the identified component in an updated graphical model. In an additional aspect, the method further includes the step of performing the desired type of analysis on the updated graphical model.

In another embodiment in a graphical model environment, a system for analyzing graphical models includes a graphical model with multiple components. The system also includes a first collection of model component patterns. Each model component pattern in the first collection is associated with information indicating a type of analysis with which the component pattern is incompatible. At least one model component pattern from the first collection is used to identify at least one of the components in the graphical model that is incompatible with a desired type of analysis. The system additionally includes a software tool. The software tool uses at least one model component pattern from the first collection to examine the components in the graphical model. The examination identifies at least one of the components in the graphical model that is incompatible with the desired type of analysis.

In one aspect of the illustrative embodiment, the system further includes a second collection of multiple model component patterns. Each model component pattern in the second collection is associated with a corresponding model component pattern in the first collection of model component patterns. At least one model component pattern from the second collection of model component patterns is used by the software tool to abstract a component identified in the graphical model as being incompatible with the desired model analysis. The component from the second collection that is used in abstracting the identified component takes the place of the identified component as a simplified component in an updated model.

In an embodiment, a method of designing graphical models includes the step of providing an original graphical model. The original graphical model includes multiple components. The method also identifies programmatically at least one of the multiple components as including elements capable of abstraction. The method abstracts the at least one identified component into a simplified component form that replaces the identified component in an updated graphical model. The method additionally displays the updated graphical model to a user.

In another embodiment, a method of designing models includes the step of providing an original model. The original model includes multiple components. The method also identifies programmatically at least one of the multiple components as including elements capable of abstraction. The method abstracts the at least one identified component into a simplified component form that replaces the identified component in an updated model. The method additionally displays the updated model to a user.

BRIEF DESCRIPTION OF THE DRAWINGS

The invention is pointed out with particularity in the appended claims. The advantages of the invention described above, as well as further advantages of the invention, may be better understood by reference to the following description taken in conjunction with the accompanying drawings, in which:

DETAILED DESCRIPTION

The illustrative embodiment of the present invention provides a template-driven automated system for abstracting computer models prior to analysis. The use of collections of saved patterns cross-referenced with types of analysis avoids time-consuming conventional methods which tend to be error-prone. Changes made to a model are displayed to a user. In the event that it is determined that the updated model fails to approximate the performance or requirements of the original model, the abstraction process may be reversed for each model component by the user selecting a provided indicator.

Figure 1:
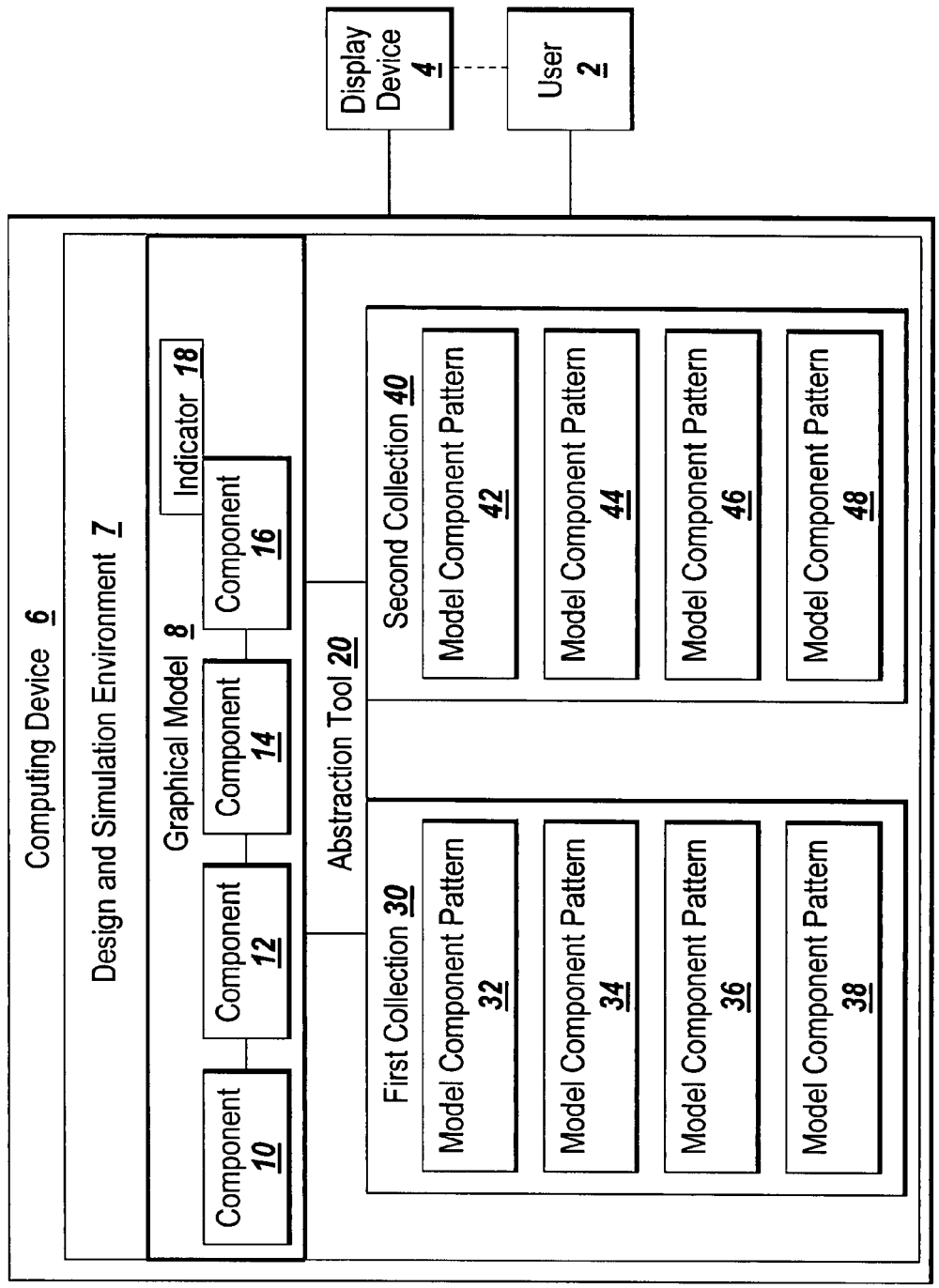
FIG. 1 depicts an environment suitable for practicing the illustrative embodiment of the present invention.

FIG. 1 depicts an environment suitable for practicing the illustrative embodiment of the present invention. A computing device 6 hosts a design and simulation environment 7 which includes a graphical model 8. The graphical model 8 may be a UML diagram, block diagram model, a statechart, a graphical representation of a finite state machine, a control flow diagram, a data flow diagram, an entity flow diagram, or other type of graphical model. The graphical model 8 includes multiple components 10, 12, 14 and 16. The graphical model 8 may be displayed to a user 2 on a display device 4. The computing device 6 also hosts or provides access to a first collection 30 of a plurality of model component patterns. The first collection 30 includes model component patterns 32, 34, 36 and 38. Each model component pattern is associated with information indicating a type or types of analysis with which the model component pattern is incompatible. An abstraction tool 20 receives the type of analysis the user wishes to perform on the graphical model and searches the first collection to identify model component patterns 10, 12, 14 or 16 that are incompatible with that type of analysis. The abstraction tool 20 will then search the graphical model 8 to identify component patterns 10, 12, 14 or 16 that appear in the graphical model.

The computing device 6 also hosts or provides access to a second collection 40 of a plurality of simplified model component patterns. The second collection 40 includes model component patterns 42, 44, 46 and 48. Each simplified model component pattern 42, 44, 46 and 48 is associated with one of the model component patterns in the first collection 30. Once the abstraction tool 20 has identified a pattern in the graphical model 8 as incompatible with the type of analysis the user wishes to perform, the abstraction tool substitutes the simplified model component pattern 42, 44, 46 or 48 for the identified pattern and creates an updated model. The abstraction tool 20 continues the search until each component in the model has been checked for compatibility with the desired type of analysis. A visual indicator 18 may be attached to any updated model component to show that the component has been abstracted. The indicator 18 is selectable by the user to show the previous component and/or to reverse the abstraction process. The use of the indicator 18 is discussed further below.

In FIG. 1, the computing device 6 may be a PC, workstation, server, laptop, PDA, or some other type of computing device equipped with a processor and capable of hosting the design and simulation environment 7. The display device 4 may be any type of computer monitor or other video display device capable of displaying the graphical model representation to the user 2. The design and simulation environment 7 may be a block diagram design and simulation environment, such as SIMULINK from The MathWorks, Inc. of Natick, Mass. or LABVIEW from National Instruments, Inc. of Austin, Tex., a statechart and/or control flow diagramming environment, such as STATEFLOW from The MathWorks, Inc., STATEMATE, from iLogic, Inc. of Toronto, Canada and DYMOLA from Dynasim AB of Lund, Sweden, a data flow diagram environment, a UML modeling environment or some other type of design and simulation environment. The graphical model 8 may be a block diagram, data flow diagram, statechart or some type of graphical model. The graphical model may include an embedded textual element such as a SIMULINK block diagram with an embedded MATLAB function (MATLAB is a textual technical computing programming language from The MathWorks, Inc.).

The abstraction tool 20 is software that may be provided as part of the design and simulation environment 7 or as a separate application or plug-in. The first and second collection of model component patterns 30 and 40 may store the model component patterns in any type of data structure accessible by the abstraction tool 20 (e.g.: in an .mdl file, in a table, as objects in a linked list, etc.). The model component patterns may be a single graphical model component or a collection of model components. The model component patterns 42, 44, 46 or 48 in the second collection 40 that are used to replace the model component patterns 32, 34, 36 or 38 identified in the graphical model 8 may substitute multiple components for a single component, multiple components for multiple components, a single component for a single component or a single component for multiple components. It will be appreciated by those skilled in the art that the actual substitution performed during the abstraction will be design-specific in that the updated model will be expected to approximate the execution of the original model and satisfy any boundary conditions or constraints for the original design. In addition to graphical components, the model component patterns in the first and second collection 30 and 40 may include a textual pattern referenced in a graphical component. For example, the model component patterns may include the text found in an MATLAB function that would be used as an embedded MATLAB function block in a SIMULINK model.

It will be appreciated by those skilled in the art that the components depicted in FIG. 1 may appear in different combinations without departing from the scope of the present invention. For example, the first and second collections 30 and 40 could be saved in a single database rather than separately. Alternatively, the first and second collections could be stored at locations remote from the computing device 6. Similarly, the abstraction tool 20 and the first and second collections 30 and 40 could be bundled into a single stand-alone application or a single plug-in.

Figure 2:
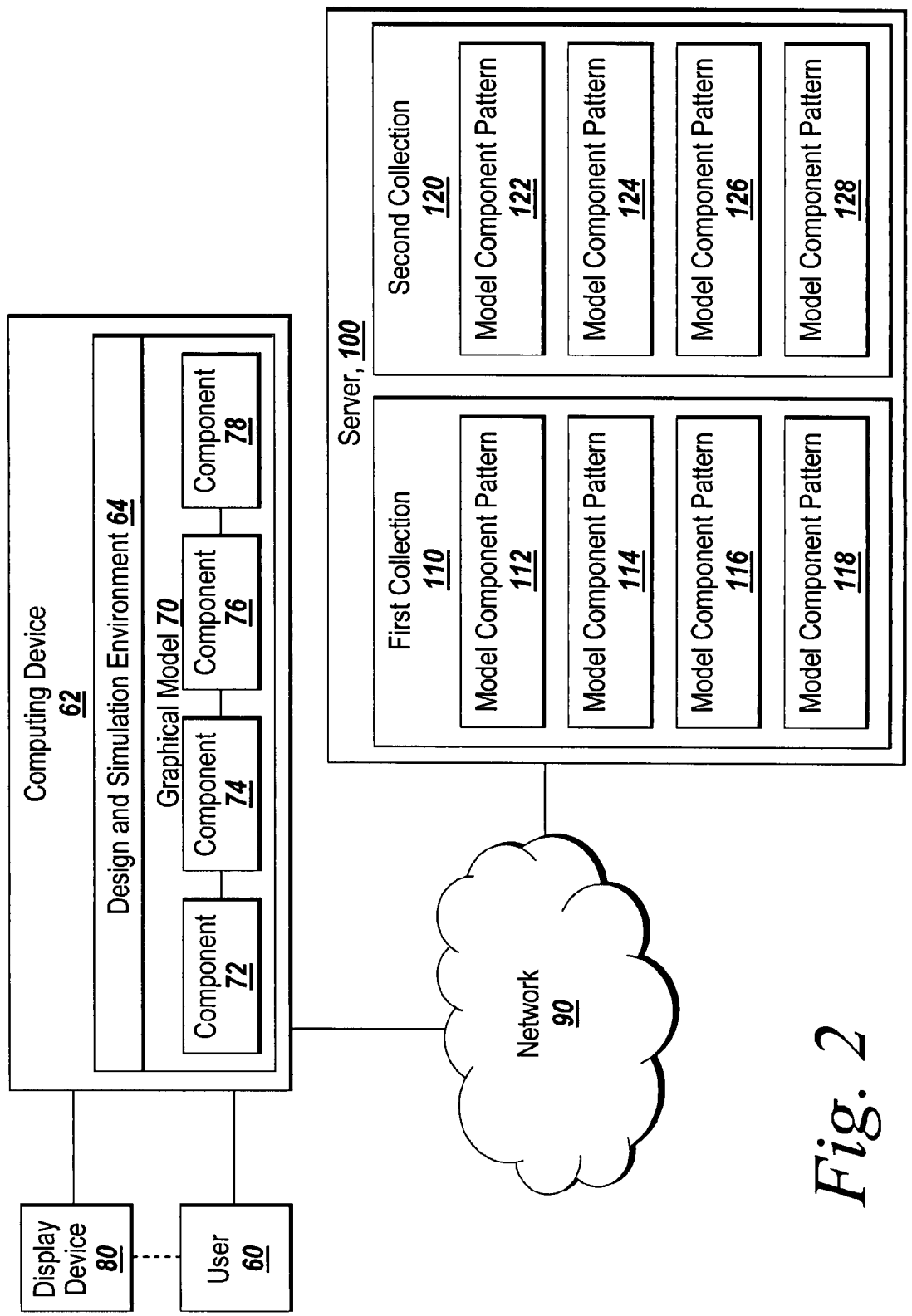
FIG. 2 depicts an alternative distributed environment suitable for practicing the illustrative embodiment of the present invention.

The illustrative embodiment may also be practiced using a distributed architecture. FIG. 2 depicts an exemplary distributed architecture in which a computing device 62 and a server 100 communicate across a network 90. The network 90 may be the Internet, a local area network (LAN), a wide area network (WAN), a wireless network, an intranet, an extranet or some other type of network. The computing device 62 hosts a design and simulation environment 64 that includes the graphical model 70. The graphical model includes components 72, 74, 76 and 78. A user 60 accessing the computing device 62 views the representation of the graphical model 70 on a display device 80 that is communicating with the computing device. A server 100 stores the first collection of model component patterns 100 and the second collection of model component patterns 120. The first collection of model component patterns may include multiple component patterns 112, 114, 116, 118 while the second collection of model component patterns may include model component patterns 122, 124, 126 and 128. The abstraction tool in the design and simulation environment (not shown) retrieves and searches the model component patterns in the first and second collections 110 and 120 as needed to perform the abstraction.

The updated model produced by the abstraction tool 20 may provide an indicator associated with an updated component. For example, in FIG. 1, an indicator 18 is provided for an updated model component 16 in the graphical model 8. The indicator 18 is a user interface element selectable by the user in any of a number of different ways to reveal the previous component version that was abstracted into the current model component. For example, the indicator may be a button that may be activated by a user manipulating a pointing device to click or double click on the button. The indicator may also allow the user to reverse the abstraction process by entering/selecting a command. The availability of the indicator allows a user to quickly reverse the results of unsatisfactory abstraction processes.

For example, the execution of the updated model containing the simplified component may produce an output that is not approximately equivalent to the original model execution. The determination as to whether the updated model's output is approximately equivalent may be determined programmatically in some cases where the output of the model is a measurable quantity and the designer/user had provided a pre-defined value setting for an allowable variance from the original models value. The determination may be based on a user-defined parameter, a minimum norm measure of accuracy, or an adaptable abstraction to achieve a given measure of accuracy. The illustrative embodiment of the present invention may also allow failure handling that notifies a user in the event the output is not approximately equivalent and allows the use of the indicator to reverse the unsatisfactory abstraction.

Alternatively, the user may manually decide whether the updated model performs in an approximately equivalent manner. Similarly, the original model may be subject to boundary conditions and constraints and the use of the indicator allows a user to reverse the abstraction process where the use of the simplified component would violate those constraints.

In an alternate implementation, the illustrative embodiment of the present invention may be practiced to enhance the design process without reference to a model analysis desired by a user. For example, a first collection of model components may include model components without reference to a particular type of analysis that are cross-reference by simplified components contained in a second collection of model components. The abstraction tool then searches a graphical model for model components listed in the first collection, and where found, replaces the components with a simplified form of components from the second collection of components that deliver approximately similar functionality. Depending on the system being modeled, it may be beneficial to the designer to depict the system using the simplified components. Alternately, the designer could use the abstraction process as a debugging process to make sure the proper complex model component is being used.

Figure 3:
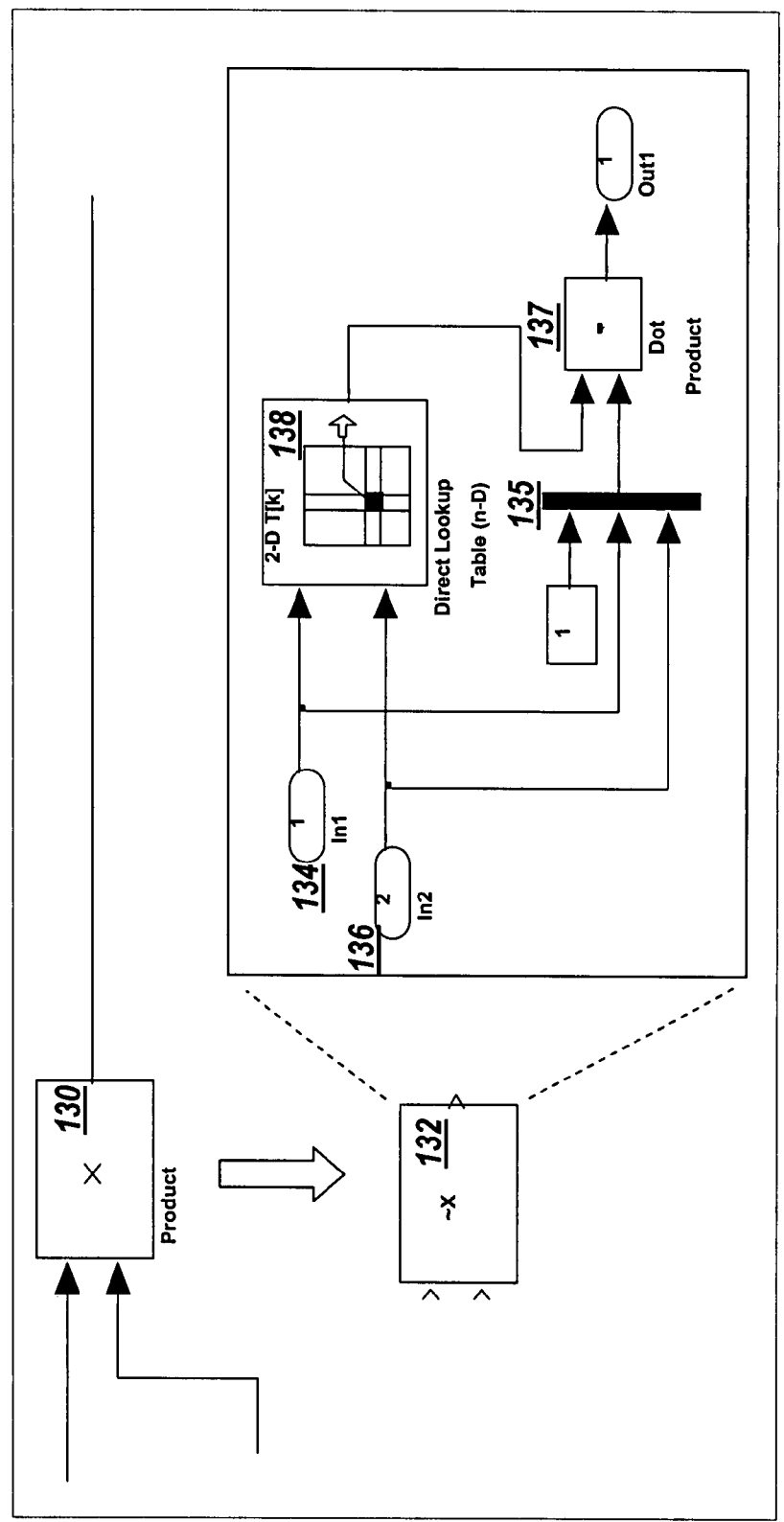
FIG. 3 depicts a block diagram model component being abstracted by the illustrative embodiment of the present invention.

FIG. 3 depicts the illustrative embodiment of the present invention abstracting a multiply operation for the situation where a desired analysis is unable to handle non-linear operations. The original multiply operation block 130 is abstracted into the simplified component 132 which includes multiple elements. In particular, the multiplication is achieved by looking up a three element vector 135 that defines a plane. The dot product 137 then computes a point on that plane, which is the approximated multiplication result. This procedure has made the general multiply operator piecewise linear in each of the 2 dimensional intervals of the look-up table. The effect of the abstraction is to change a non-linear operation that was unsuitable for a desired analysis into an operation that produces a linear function of the input 134 and 136 within each interval of the lookup table 138. Following the abstraction, the desired analysis can be performed.

In general, nonlinear mathematical operations such as basic multiplication and quadratic functions but also transcendental operations such as trigonometric operations can be replaced by piecewise linear look-up tables. The accuracy of the approximation may be selected by the user and will determine the grain of piecewise linear regions. Alternately, the grain of piecewise linear regions may be automatically selected, for example based on the absolute or relative tolerance of the numerical solver that is selected to generate behavior. In one implementation, the accuracy could be based on a minimum norm computation.

Figure 4A:
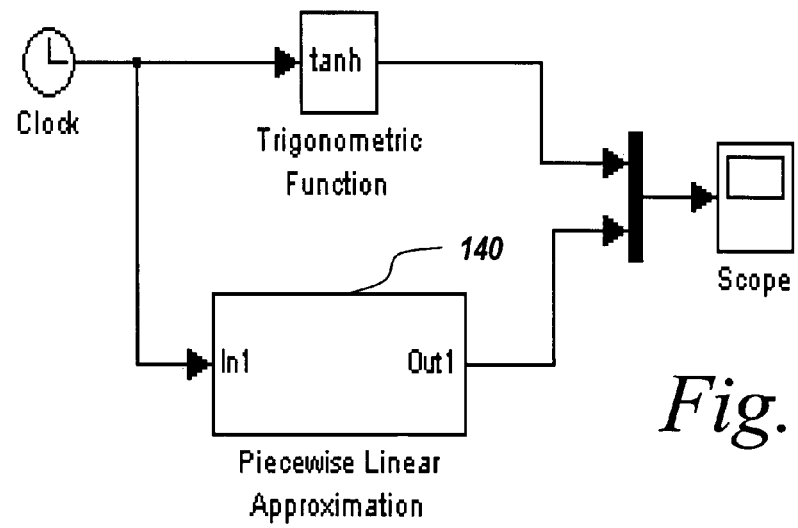
FIG. 4A depicts a model which includes a component for which piecewise linear approximation is performed.
Figure 4B:
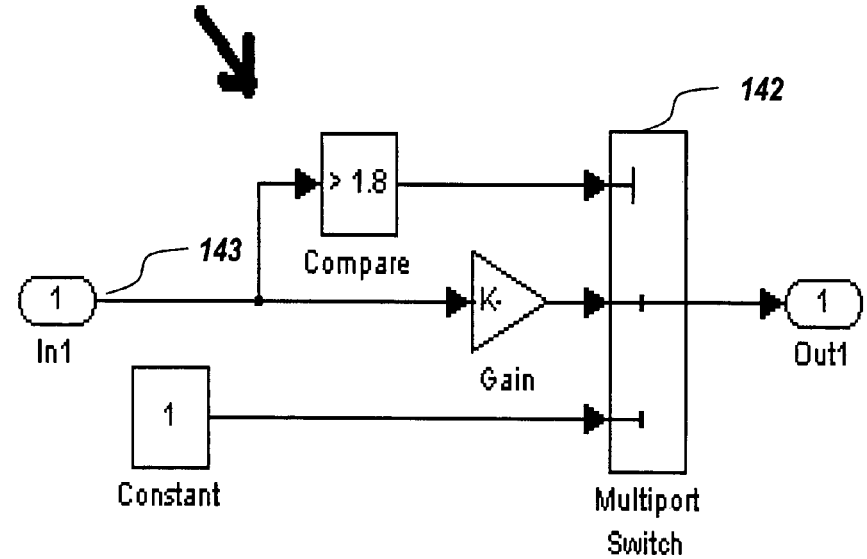
FIG. 4B depicts a switch block in the piecewise linear approximation that is used to select appropriate linear behavior.
Figure 4C:
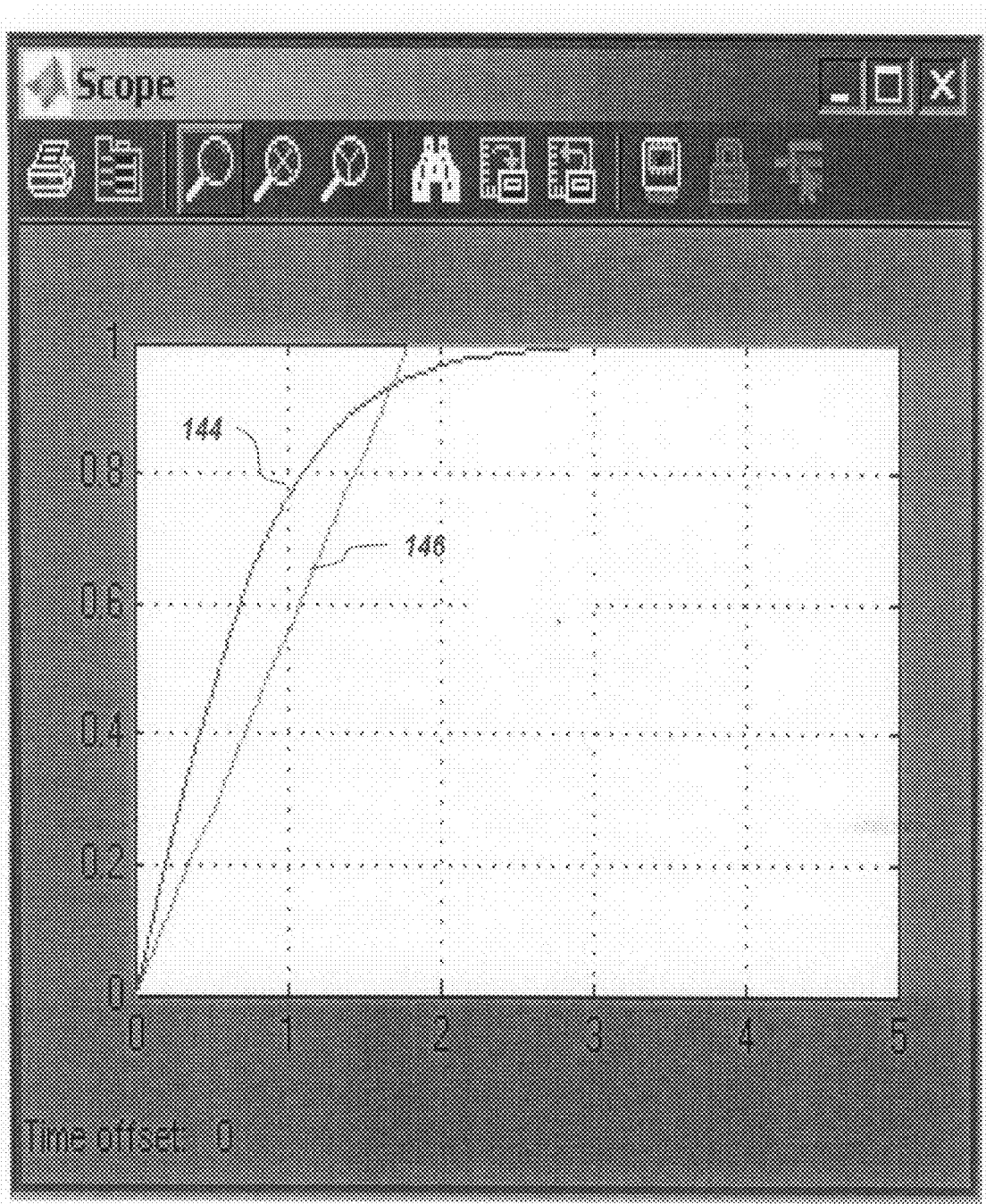
FIG. 4C depicts the resulting approximation from the use of the switch block.

The piecewise linear behavior may be modeled by linear operations with a control structure superimposed to implement the selection of the region of linear behavior as illustrated in FIG. 4A where a model includes a piecewise linear approximation 140. The piecewise linear approximation 140 is shown in greater detail in FIG. 4B which shows a hyperbolic tangent that is approximated by a direct relation and a saturated relation. A switch block 142 is used to select the appropriate linear behavior based on whether the value of In1 143 is larger than 1.8, which implements the control structure. The resulting approximation is shown in FIG. 4C. A first curve 144 represents the hyperbolic tangent behavior, and a second curve 146 is the linear approximation by using two regions of piecewise linear behavior. The approximation can be improved by using more such piecewise linear regions.

Figure 4D:
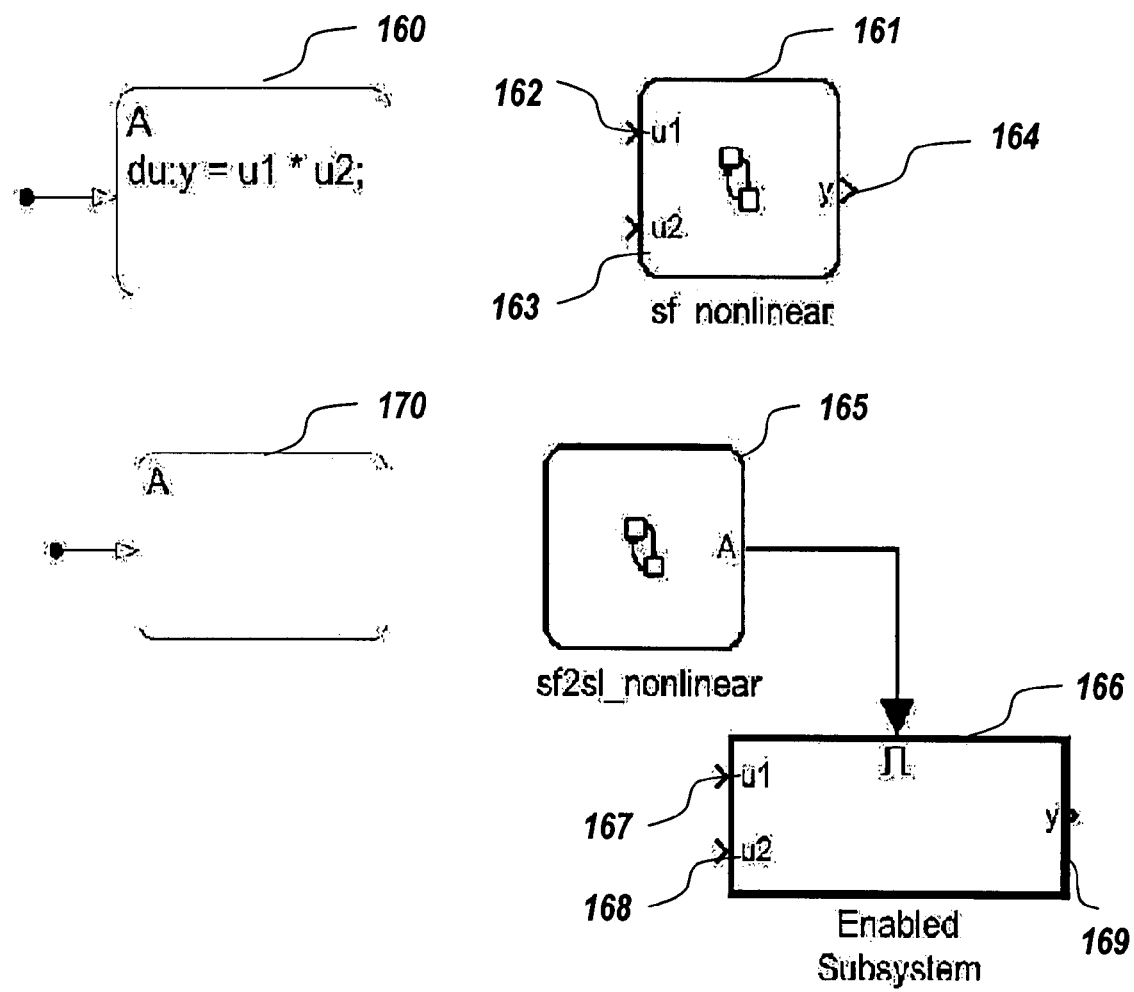
FIG. 4D depicts a Stateflow chart where a non-linear operation is performed.

Nonlinear operations in a Stateflow diagram may also be made piecewise linear. This is illustrated in FIG. 4D, where a nonlinear operation y=u1*u2 is performed during the active status of state A 160 inside a Stateflow chart 161. The Stateflow chart, sf_nonlinear 161, has input u1 162 and u2 163 and output y 164. Alternatively, the nonlinear behavior can first be implemented in Simulink, which is shown by the Stateflow chart sf2s1_nonlinear 165 connected to the Enabled Subsystem 166. The Enabled Subsystem 166 now contains the nonlinear operation, and so it has the input u1 167 and u2 168, and produces the output y 169. The Enabled Subsystem 166 is active when the Stateflow chart is in state A 170.

Figure 4E:
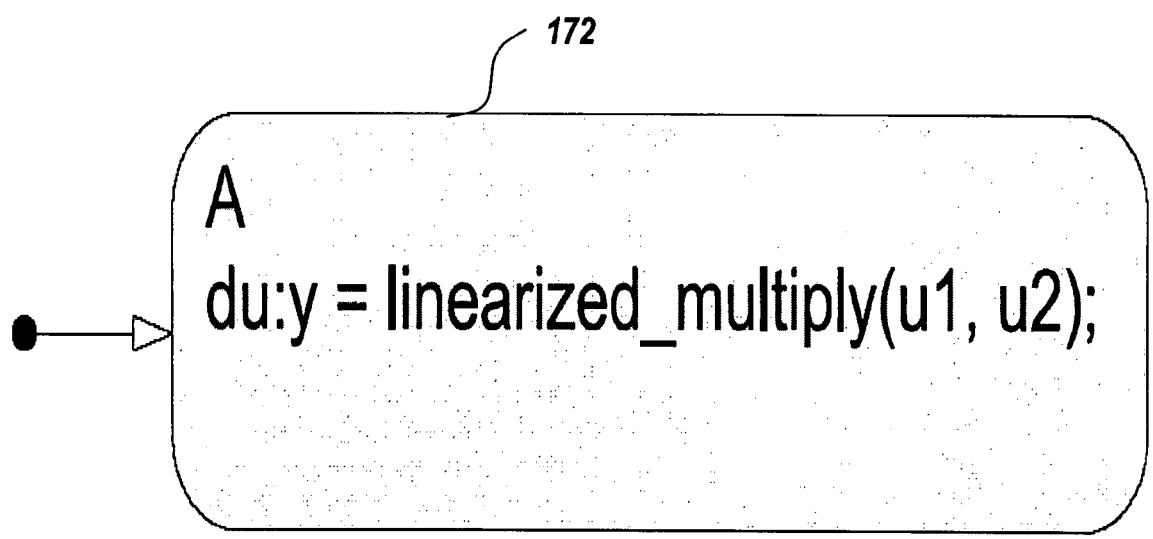
FIG. 4E depicts a piecewise linear function call.

In one aspect of the present invention, the nonlinear operation in a Stateflow chart can be linearized directly by replacing the operation by a piecewise linear function call 172 as shown in FIG. 4E.

Figure 5:
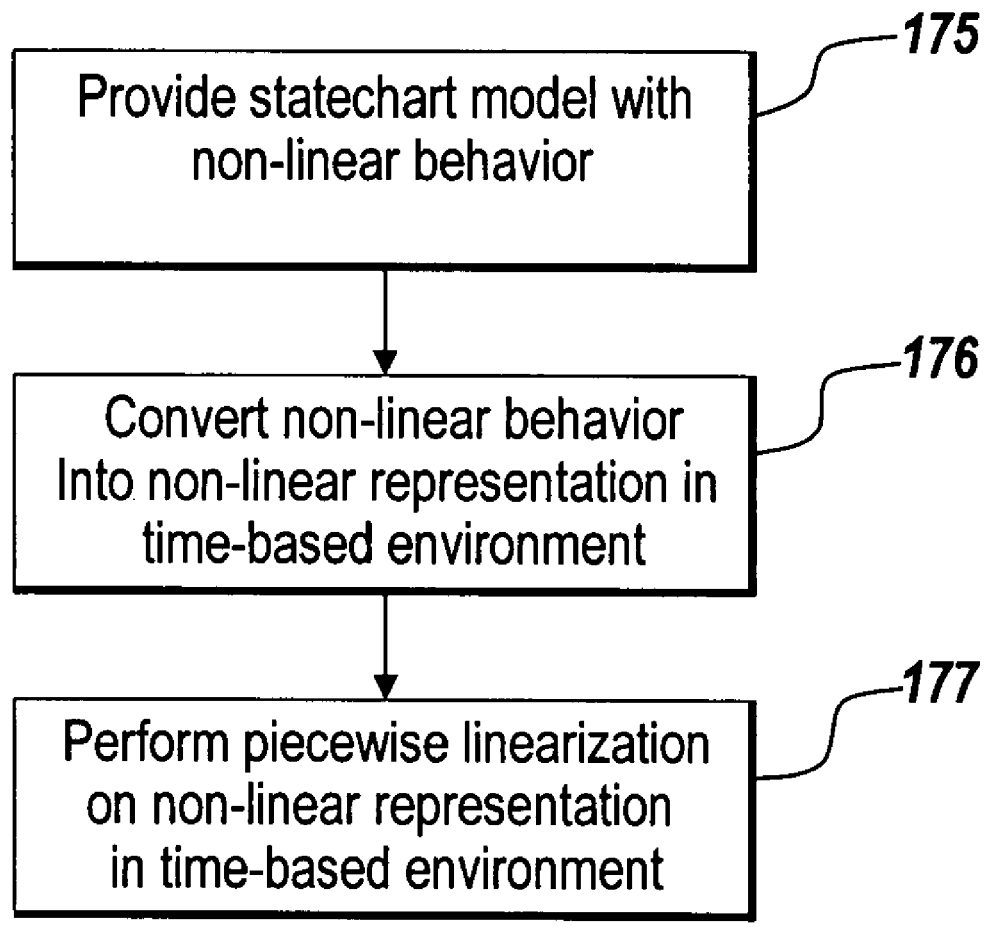
FIG. 5 is a flowchart of a sequence of steps followed by the illustrative embodiment of the present invention to perform piecewise linearization utilizing multiple modeling environments.

In another aspect of the present invention, the piecewise linearization may be performed utilizing multiple modeling environments as set forth in the flowchart of FIG. 5. The sequence of steps begin with the providing of a statechart model, such as a STATEFLOW model, which includes non-linear behavior (step 175). The non-linear behavior is then converted into a nonlinear representation in a time-based environment, such as a SIMULINK environment (step 176). The nonlinear representation is then piecewise linearized (step 177).

It should be noted that the nonlinear operations that can be made piecewise linear may be used anywhere in a Stateflow chart. They may be associated, for example, with during actions, entry actions, transition actions, and condition actions. Those skilled in the art will appreciate that the linearization can be equally applied to Embedded MATLAB blocks and other modeling modalities.

Figure 6:
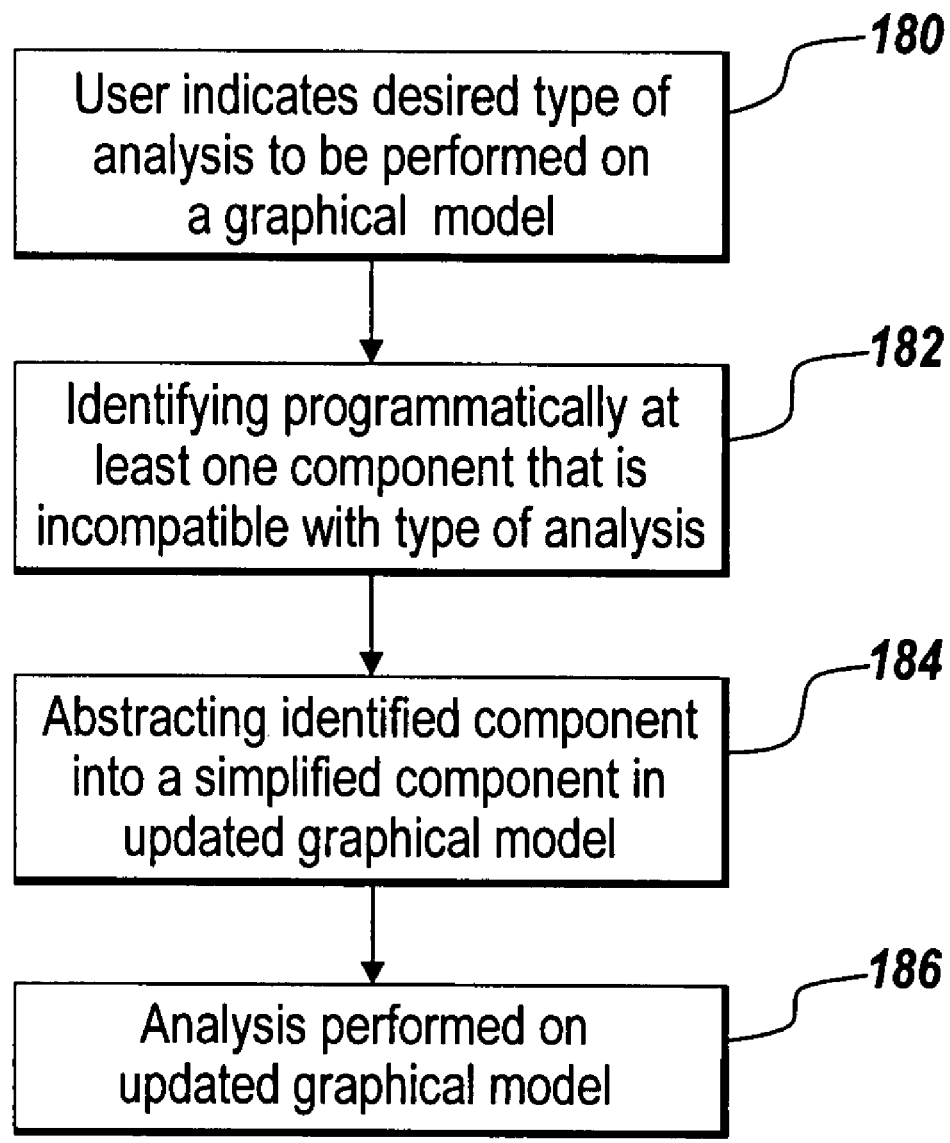
FIG. 6 is a flowchart of a sequence of steps followed by the illustrative embodiment of the present invention to abstract a component in a graphical model.

The sequence of steps followed by the illustrative embodiment to abstract a model component is depicted in the flowchart in FIG. 6. The designer provides an indication of the desired type of analysis to be performed on a graphical model (step 180). With reference to the depicted elements shown in FIG. 2, the abstraction tool 20 searches the first collection 30 of model components 32, 34, 36 and 38 to find those components associated with the indicated type of analysis. The abstraction tool 20 then walks the graphical model 8 to programmatically identify at least one component 10, 12, 14 or 16 that is incompatible with the desired type of analysis (step 182). Each block type encountered in the model is compared against the identified listing of one or more types of blocks retrieved from the first collection of blocks that are incompatible with the desired type of analysis (in an alternate implementation, the abstraction tool looks for combinations of blocks). Once a match is identified, the abstraction tool 20 abstracts the identified component 16 by replacing the identified component with an associated simplified component from the second collection 40 of model components 42, 44, 46 or 48 (step 184). The process continues until all of the components incompatible with the desired type of analysis have been abstracted out of the model 8. The analysis may then be performed on the updated graphical model (step 186).

Figure 7:
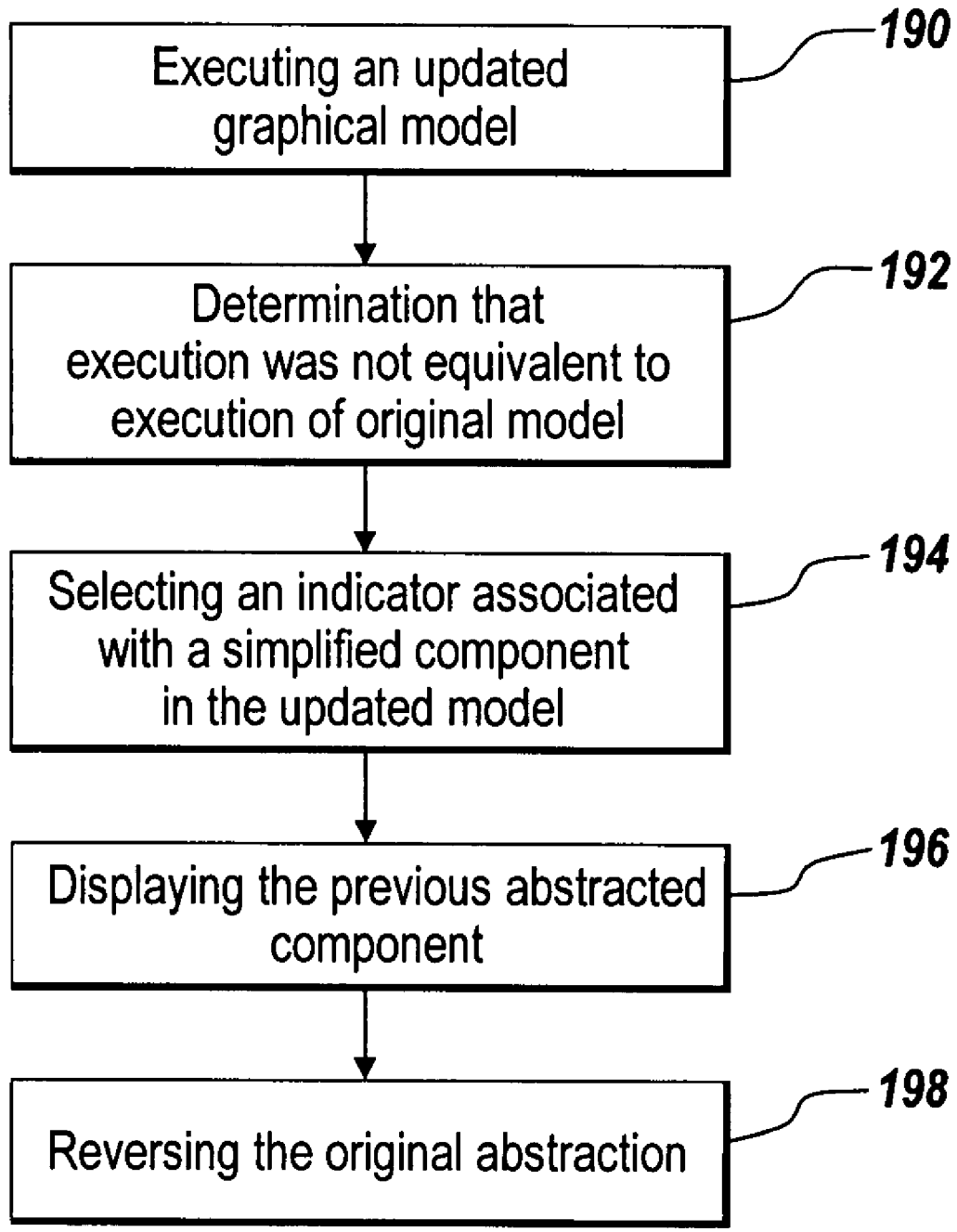
FIG. 7 is a flowchart of the sequence of steps followed by the illustrative embodiment of the present invention to reverse an abstraction performed on a component in a graphical model.

As noted above, an indicator may be associated with an updated model component as a means to inspect and/or reverse the abstraction process. The flowchart of FIG. 7 depicts the use of the indicator by the illustrative embodiment. The sequence begins with the execution of the updated graphical model (step 190) that has been created using the abstraction process outlined in FIG. 6. A determination is then made that the execution of the updated graphical model was not approximately equivalent to the execution of the original model (step 192). As noted previously, the determination may be made programmatically in those cases where the execution output creates a value that may be compared to previously supplied variance value. Otherwise, the determination of the lack of equivalency may be made manually by a user. Once the determination has been made, the user selects a visual indicator associated with a simplified component in the updated model (step 194). The form of the indicator, which is a user interface element selectable by a user, may vary greatly. For example, it may be a radio button, pull-down menu, a text box which accepts a pre-determined command or another type of known user interface element. The selection of the indicator may result in the display of, or reference to, the previously abstracted component (step 196). The user may then reverse the previously performed abstraction by entering or selecting a command through the abstraction tool or other provided user interface (step 198). Those skilled in the art will recognize that other sequences of steps in the abstraction reversal process other than those depicted in FIG. 7 are possible within the scope of the present invention. For example, the user selection of the indicator may result in an abstraction reversal without an intermediate display of, or reference to, the original component. Similarly, where an updated model includes several updated components, the user may inspect several original components through the indicator and only reverse the abstraction process for a portion of those components that were inspected. Likewise, the user may choose from a plurality of possible abstractions, other than the presently active one.

Although the discussion contained herein has been made with reference to graphical models, it will be appreciated that the techniques discussed above may also be utilized for non-graphical models. In a textual model implementation, the first and second collections contain textual components. The abstraction tool analyzes a textual model to identify components in the first collection and optionally display the results to the user. The abstraction tool may then replace one textual component from the original model with a simplified component from the second collection. Similarly to the graphical model implementations, the abstraction tool may identify components in the textual model as an aid to design or as part of an inspection to determine whether a model is suitable for desired type of analysis.

The present invention may be provided as one or more computer-readable programs embodied on or in one or more mediums operating alone or in combination. The mediums may be a floppy disk, a hard disk, a compact disc, a digital versatile disc, a flash memory card, a PROM, a RAM, a ROM, a magnetic tape, or a field programmable gate array (FPGA). In general, the computer-readable programs may be implemented in any programming language. Some examples of languages that can be used include MATLAB, C, C++, C#, JAVA, or a hardware description language (HDL). The software programs may be stored on or in one or more mediums as object code.

Since certain changes may be made without departing from the scope of the present invention, it is intended that all matter contained in the above description or shown in the accompanying drawings be interpreted as illustrative and not in a literal sense. Practitioners of the art will realize that the sequence of steps and architectures depicted in the figures may be altered without departing from the scope of the present invention and that the illustrations contained herein are singular examples of a multitude of possible depictions of the present invention.

I claim:

1. A method of analyzing textual models, comprising:
providing an original textual model, the original textual model including a plurality of components;
displaying the original textual model to a user on a display device;

indicating a desired type of analysis to be performed on the original textual model;

identifying programmatically at least one of the plurality of components as including elements incompatible with the desired type of analysis;

providing a first collection of model component patterns, each model component pattern associated with information indicating a type of analysis with which the component pattern is incompatible;

providing a second collection of model component patterns;

wherein the second collection of model component patterns may substitute any one of the following: multiple patterns of the second collection for a single pattern of the first collection, multiple patterns of the second collection for multiple patterns of the first collection, a single pattern of the second collection for a single pattern of the first collection or a single pattern of the second collection for multiple patterns of the first collection and abstracting programmatically the at least one identified component into a simplified component form compatible with the desired type of analysis, the simplified component form replacing the identified component in an updated textual model.

2. The method of claim 1, further comprising:

performing the desired type of analysis on the updated textual model.

3. The method of claim 2, wherein the original textual model was subject to at least one of constraints or boundary conditions and wherein the method further comprises:

verifying programmatically that the at least one of constraints or boundary conditions are satisfied during the execution of the updated model.

4. The method of claim 1, comprising further:

verifying that the updated model produces an output upon execution that is determined, based on a previously supplied parameter, to be approximately equivalent to the output produced by the execution of the original textual model, wherein the approximately equivalent output may be determined either: programmatically, where the output of the original model and the output of the updated model are measurable values and where a user had pre-defined an allowable output value variance of the value of the updated model from the value of the original model, or manually, through a decision by the user.

5. The method of claim 4 wherein the previously supplied parameter is user-defined.

6. The method of claim 4 wherein the previously supplied parameter is a minimum norm measure of accuracy.

7. The method of claim 4 wherein the previously supplied parameter is an adaptable abstraction to achieve a given measure of accuracy.

8. The method of claim 4, further comprising:

notifying the user in the event the output does not satisfy a boundary condition or a constraint for the original textual model.

9. The method of claim 1 wherein the abstracting uses a look-up table.

10. A computer-implemented method of analyzing graphical or textual models, comprising:

providing an original model, the original model including a plurality of components;

indicating a desired type of analysis to be performed on the original model;

identifying programmatically, using a processor, at least one of the plurality of components as including elements incompatible with the desired type of analysis;

abstracting programmatically the at least one identified component into a simplified component compatible with the desired type of analysis, the simplified component replacing the identified component in an updated model; and verifying that the updated model produces an output upon execution that is determined, based on a previously supplied parameter, to be approximately equivalent to output produced by execution of the original model;

wherein the approximately equivalent output may be determined either:

programmatically, where the output of the original model and the output of the updated model are measurable values and where a user had pre-defined an allowable output value variance of the value of the updated model from the value of the original model, or manually, through a decision by the user.

11. The method of claim 10 further comprising the user selecting a visual indicator associated with the simplified component in the updated model.

12. The method of claim 11 wherein the visual indicator may be a radio button, pull-down menu, text box which accepts a pre-determined command, or another type of known user interface element.

13. The method of claim 12 further comprising displaying the simplified component responsive to the user selecting the visual indicator.

14. The method of claim 13 further comprising reversing the previously performed abstracting by action of the user selecting a reversing command acting through an abstraction tool to implement reverse operation of the abstracting.

15. The method of claim 13 wherein the user selection of the indicator results in an abstraction reversal without an intermediate display of the original component.

16. The method of claim 15 wherein the updated model includes a plurality of updated components and further comprising the user inspecting a plurality of original components through the visual indicator and reversing the abstracting for a portion of the plurality of inspected original components.

* * * * *